US011029421B2

(12) United States Patent
Cheng et al.

(10) Patent No.: US 11,029,421 B2
(45) Date of Patent: Jun. 8, 2021

(54) FLUORESCENT NITROGEN-VACANCY DIAMOND SENSING SHEET, MANUFACTURING METHOD AND USES THEREOF, SENSOR, AND LITHOGRAPHY APPARATUS

(71) Applicants: NATIONAL SYNCHROTRON RADIATION RESEARCH CENTER, Hsinchu (TW); ACADEMIA SINICA, Taipei (TW)

(72) Inventors: Bing-Ming Cheng, Hsinchu (TW); Hsiao-Chi Lu, Hsinchu (TW); Jen-Iu Lo, Hsinchu (TW); Huan-Cheng Chang, Taipei (TW)

(73) Assignees: National Synchrotron Radiation Research Center, Hsinchu (TW); Academia Sinica, Taipei (TW)

( * ) Notice: Subject to any disclaimer, the term of this patent is extended or adjusted under 35 U.S.C. 154(b) by 52 days.

(21) Appl. No.: 16/557,268

(22) Filed: Aug. 30, 2019

(65) Prior Publication Data

US 2021/0063587 A1    Mar. 4, 2021

(51) Int. Cl.
*G01J 1/58* (2006.01)
*G01T 1/202* (2006.01)
(Continued)

(52) U.S. Cl.
CPC ............ *G01T 1/2023* (2013.01); *G01J 1/429* (2013.01); *G01J 1/58* (2013.01); *H01L 31/02322* (2013.01); *H01L 31/09* (2013.01)

(58) Field of Classification Search
CPC . G01J 1/429; G01J 1/4257; G01J 1/58; H01L 31/028; H01L 31/09
See application file for complete search history.

(56) References Cited

U.S. PATENT DOCUMENTS 8,168,413 B2    5/2012   Chang et al.
10,364,389 B1 *  7/2019   Shenderova ......... C09K 11/025
(Continued)

OTHER PUBLICATIONS

Huan-Cheng Chang, Hsiao-Chi Lu, Yu-Chain Peng, Sheng-Lung Chou, Jen-Iu Lo, & Bing-Ming Cheng; Far-UV Excited Luminescence of Nitrogen-Vacancy Centers:Evidence for Diamonds in Space, Angew. Chem. Int. Ed. 56, 14469-14473 (2017)—6 pages.
(Continued)

*Primary Examiner* — David P Porta
*Assistant Examiner* — Fani Boosalis
(74) *Attorney, Agent, or Firm* — Muncy, Geissler, Olds & Lowe, P.C.

(57) ABSTRACT

The present disclosure provides a fluorescent nitrogen-vacancy diamond (FNVD) having a plurality of nitrogen-vacancy centers with a concentration about 1 ppm to 10,000 ppm. The FNVD as built-in fluorophores exhibit a nearly constant emission profile over 540 nm to 850 nm upon excitation by vacuum ultraviolet (VUV), extreme ultraviolet (EUV) and X-rays for the energy larger than 6.2 eV. Applying the FNVD sensor can measure VUV/EUV/X-rays as a sensing sheet, manufacturing method and uses thereof, sensor and lithography apparatus. The superb photostability and broad applicability of FNVDs offer a promising solution for the long-standing problem of lacking robust and reliable detectors for VUV, EUV, and X-rays.

17 Claims, 17 Drawing Sheets

(51) Int. Cl.
*G01J 1/42* (2006.01)
*H01L 31/0232* (2014.01)
*H01L 31/09* (2006.01)

(56) References Cited

U.S. PATENT DOCUMENTS

2006/0001029 A1 1/2006 Hayashi et al.
2017/0184451 A1 6/2017 Godfried

OTHER PUBLICATIONS

L. Rondin, G. Dantelle, A. Slablab, F. Grosshans, F. Treussart, P. Bergonzo, S. Perruchas, T. Gacoin, M. Chaigneau, H.-C. Chang, V. Jacques, & J.-F. Roch, Surface-induced charge state conversion of nitrogen-vacancy defects in nanodiamonds, Phys. Rev. B 82, (2010)—pp. 115449-1-115449-5.

N. Naka, H. Morimoto, I. Akimoto, Excitons and fundamental transport properties of diamond under photo-injection. Phys. Status Solidi A 213, 2551 (2016)—pp. 1-13.

M. Cohen, C. M. Anderson, A. Cowley, G. V. Coyne, W. Fawley, T. R. Gull, E. A. Harlan, G. H. Herbig, F. Holden, H. S. Hudson, R. O. Jakoubek, H. M. Johnson, K. M. Merrill, F. H. Schiffer, B. T. Soifer, B. Zuckerman, The Peculiar Object HD 44179 ("The Red Rectangle"), Astrophys. J. 196, (1975)—pp. 179-189.

G. D. Schmidt, M. Cohen, B. Margon, Discovery of Optical Molecular Emission From the Bipolar Nebula Surrounding HD 44179, Astrophys. J. 239, (1980)—pp. L133-L138.

A. N. Witt, T. D. Boroson, Spectroscopy of Extended Red Emission in Reflection Nebulae, Astrophys. J. 355, (1990)—pp. 182-189.

A. N. Witt, U. P. Vijh, Extended Red Emission: Photoluminescence by Interstellar Nanoparticles, ASP Conference Series 309, 115 (2004)—pp. 1-25.

H.-C. Lu, M.-Y. Lin, S.-L. Chou, Y. C. Peng, J.-I. Lo, B.-M. Cheng, Quantitative Analysis of Nitrogen Defect N4 in Diamond with Photoluminescence Excited in Region 170-240 nm, Anal. Chem. 86, 10497-10500 (2014)—16 pages.

H.-C. Lu, Y.-C. Peng, M.-Y. Lin, S.-L. Chou, J.-I. Lo, B.-M. Cheng, Analysis of Nickel Defect in Diamond with Photoluminescence upon Excitation near 200 nm, Anal. Chem. 87, (2015)—pp. 7340-7344.

H.-C. Lu, Y.-C. Peng, M.-Y. Lin, S.-L. Chou, J.-I. Lo, B.-M. Cheng, Analysis of boron in diamond with UV photoluminescence, Carbon 111, (2017)—pp. 835-838.

V. Kumar, A.K. Datta, Vacuum ultraviolet scintillators: sodium salicylate and p-terphenyl. Appl. Opt. 18, (1979)—pp. 1414-1417.

H.-C. Lu, H.-K. Chen, F.-F. Chen, B.-M. Cheng J. F. Ogilvie, Absorption cross section of molecular oxygen in the transition E $3\Sigma$-u v=0-X $3\Sigma$-g v=0 at 38 K, A&A, 520, A19-1-4 (2010)—pp. 1-4.

Non-final Office Action of TW family patent Application No. 108131410, dated Feb. 11, 2020.

Office Action issued in corresponding TW patent application No. 108131410 dated Sep. 18, 2020.

* cited by examiner

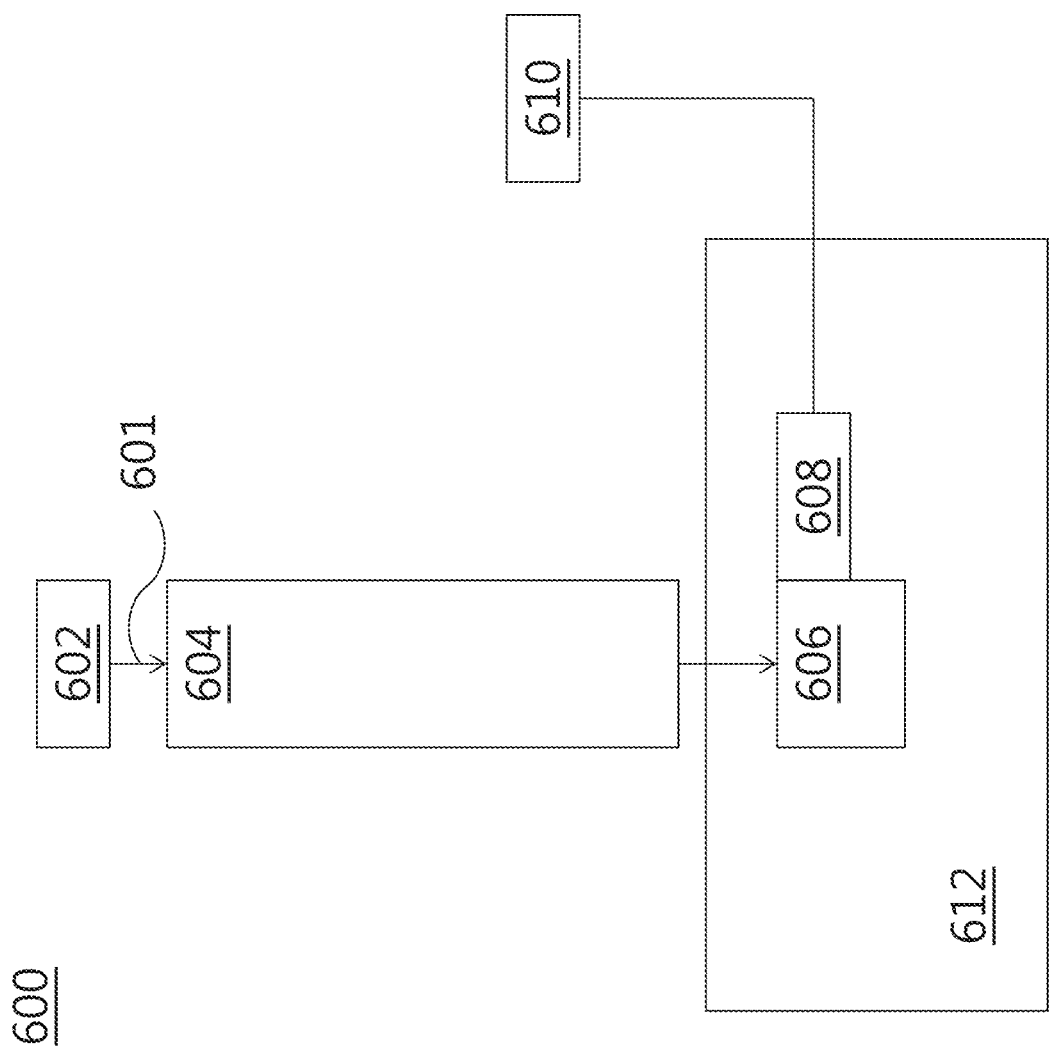

FLUORESCENT NITROGEN-VACANCY DIAMOND SENSING SHEET, MANUFACTURING METHOD AND USES THEREOF, SENSOR, AND LITHOGRAPHY APPARATUS

BACKGROUND

The present disclosure relates generally to a light-sensing component, method for manufacturing the same, and method for using the same; more particularly, the present disclosure relates to a fluorescent nitrogen-vacancy diamond (FNVD) sensing sheet, method for manufacturing the same, and method for using the same, sensor, and lithography apparatus.

The wavelength range of vacuum-ultraviolet (VUV) radiation is about 30 nm to about 200 nm, which is equivalent to the energy 6.2 eV to 41.3 eV, whereas the wavelength of extreme-ultraviolet (EUV) radiation extends to about 10 nm. Besides these wavelength ranges, there exists radiation with even greater energy such as X-ray of wavelength less than 12 nm. The most sensitive sensor among commercially available sensors for detecting these wavelength ranges is the photomultiplier (PMT), but such conventional detectors have poor quantum efficiencies because of the limited transmission of the viewport. For example, the solar-blind photomultiplier (solar blind PMT) uses a $MgF_2$ viewport; the shortest wavelength that it can detect directly is therefore about 115 nm; VUV/EUV/X-rays of wavelength less than 115 nm are not detectable using a solar-blind PMT.

To overcome the limitations of the viewport, fluorescent materials can be used as the sensor for VUV/EUV/X-rays. The operational principle of such a sensor is to excite the fluorescent material using VUV/EUV/X-rays so that it emits fluorescence; then a photomultiplier or equivalent detector is used to measure the fluorescence, so that thereby the VUV/EUV/X-rays are sensed. The conventional fluorescent materials for use as the VUV/EUV/X-ray sensor are mostly organic materials, such as sodium salicylate, which is the most commonly used fluorescent material. The energy of VUV/EUV/X-ray is great enough to break any chemical bond; the primary issue of using such organic fluorescent materials for sensing the VUV/EUV/X-ray is hence the phenomenon of a significant aging effect of the fluorescent materials.

The present disclosure uses diamonds having vacancy centers as the material for sensing VUV/EUV/X-rays, which not only expands the spectral range detectable with a conventional photomultiplier into the segment of VUV/EUV/X-ray but also addresses the issue of a significant aging effect of conventional organic fluorescent materials.

BRIEF SUMMARY OF THE INVENTION

To solve the issues existing in the prior art, the present invention implements a proper inventive concept, which can be applied using various embodiments described below.

One embodiment of the present disclosure is directed to a fluorescent nitrogen-vacancy diamond (FNVD) sensing sheet, which has a plurality of nitrogen-vacancy centers with a concentration about 1 ppm to 10,000 ppm.

In one embodiment, when absorbing a first radiation, the FNVD sensing sheet emits a second radiation; the first radiation has a wavelength range less than 250 nm, and the second radiation has a wavelength range 540 nm to 850 nm.

In one embodiment, the spectrum of the second radiation has a peak wavelength at about 573 nm to 578 nm.

In one embodiment, the FNVD sensing sheet converts the first radiation into a fluorescence with a quantum yield in a range from about 0.1 to about 17.

Another embodiment of the present disclosure is directed to a method for manufacturing an FNVD sensing sheet according to the above-mentioned embodiments, wherein the method comprises preparing a plurality of FNVD powders, and shaping the FNVD powders.

In one embodiment, the operation of preparing the FNVD powders further comprises forming a vacancy defect in a type Ib diamond powder and diffusing the vacancy defect into peripheral nitrogen atoms of the FNVD powders.

In one embodiment, the method further comprises annealing the FNVD powders with a temperature in a range from about 600 degrees Celsius to about 1000 degrees Celsius.

In one embodiment, the method further comprises mixing the FNVD powders with an additive, wherein the additive is at least one element selected from a group consisting of Mo, W, Nb, Ta, Re, Ti, V, Fe, Co, Ni, Al, Zr, Mg, Ca, Cs, Si and B, or a compound thereof.

In one embodiment, the method further comprises shaping the FNVD powders by pressing, coating or heating the FNVD powders.

In one embodiment, the method further comprises heating the FNVD powders in an oxygen-deficient or a vacuum environment to a temperature in a range from about 200 degrees Celsius to about 1500 degrees Celsius.

In one embodiment, the method further comprises removing graphitic carbon at a surface of the FNVD powder.

Another embodiment of the present disclosure is directed to a sensor, comprising a first sensing unit, involving a diamond having a plurality of nitrogen-vacancy centers with a concentration about 1 ppm to 10,000 ppm, which is configured to absorb a first radiation and emit a second radiation; and a second sensing unit, which is configured to detect the second radiation.

In one embodiment, the first radiation has a wavelength range less than 250 nm; the second radiation has a wavelength range 540 nm to 850 nm.

In one embodiment, the second sensing unit comprises a photomultiplier or a photocell or a photodiode or a solar cell.

In one embodiment, when the first radiation passes the first sensing unit and is absorbed, the first sensing unit converts the first radiation into a fluorescence with a quantum yield at least 0.1.

Another embodiment of the present disclosure is directed to a lithography apparatus, comprising a sensor as described above.

In one embodiment, the lithography apparatus further comprises a source of radiation or lamp, which is configured to emit the first radiation.

In one embodiment, the lithography apparatus further comprises a processor, which is configured to generate an emission spectrum of the second radiation.

Another embodiment of the present disclosure is directed to a method for sensing radiation, which comprises providing a FNVD sensing sheet according to above-mentioned embodiments, which has a diamond having a plurality of nitrogen-vacancy centers with a concentration about 1 ppm to 10,000 ppm; on exposing the FNVD sensing sheet to the first radiation, the FNVD sensing sheet emits the second radiation corresponding to the first radiation after being exposed to the first radiation, and generating a spectrum of the second radiation.

In one embodiment, the first radiation has a wavelength range less than 250 nm; the second radiation has a wavelength range 540 nm to 850 nm.

BRIEF DESCRIPTION OF THE DRAWINGS

FIG. 17 illustrates a lithography apparatus according to one embodiment of the present disclosure.

It should be noted that each drawing is for purpose of illustration, and shall not be construed to limit the size, number, ratio or connection relation.

DETAILED DESCRIPTION

Figure 1:
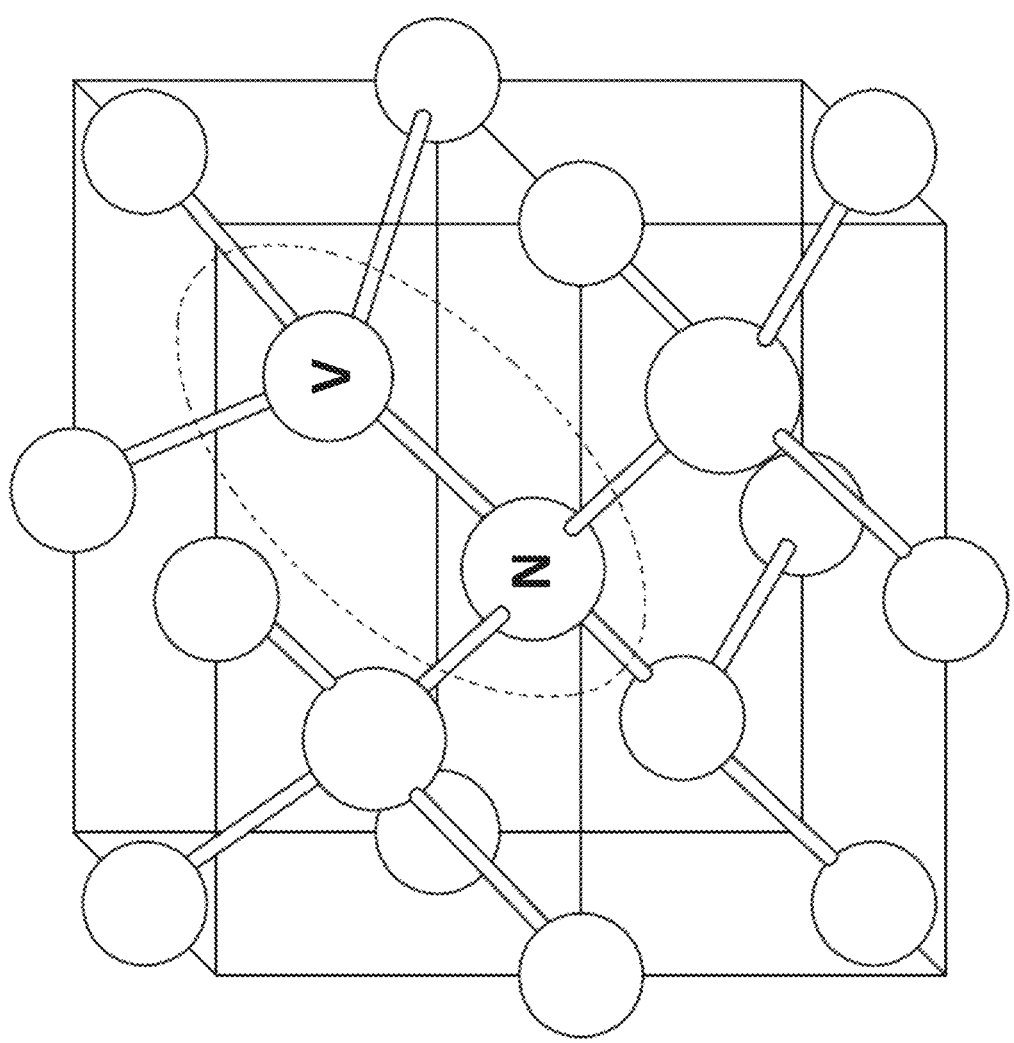
FIG. 1 is a schematic diagram showing the structure of a fluorescent nitrogen-vacancy diamond (FNVD)

Reference is made to FIG. 1; FIG. 1 is a schematic diagram showing the structure of a fluorescent nitrogen-vacancy diamond (FNVD). The nitrogen-vacancy centers (NV centers) are point defects within the diamond, which consist of a nitrogen at the nearest-neighbor lattice of the diamond and a vacancy defect; diamonds comprising such point detects are named nitrogen-vacancy diamonds. In the present disclosure, the feature that the nitrogen-vacancy diamond emits fluorescence is used to detect radiation; it is hence also called a fluorescent nitrogen-vacancy diamond.

Other than the vacancy center consisting of one nitrogen atom and one vacancy defect, in another embodiment, the vacancy center of diamond can also consist of two nitrogen atoms and one vacancy defect, which is also referred to as a H3 vacancy center (H3 center); such a structure is also a nitrogen-containing defect. In the following description, the present disclosure uses the vacancy center consisting of one nitrogen atom and one vacancy defect as an example to discuss the embodiments.

Figure 2:
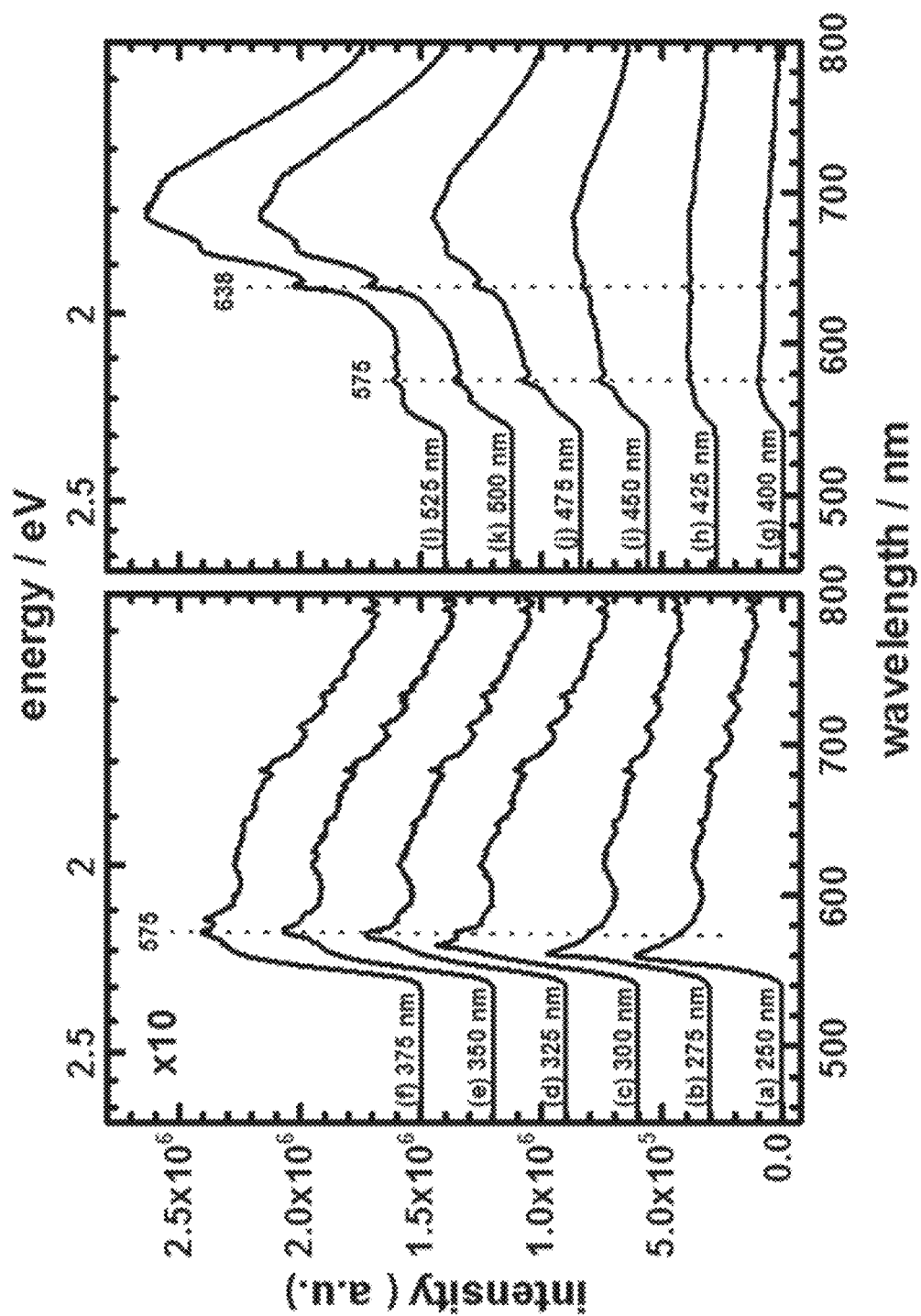
FIG. 2 shows photoluminescence (PL) spectra of the FNVD excited by radiation of wavelength 250 nm to 525 nm at a temperature about 300 K.

FIG. 2 shows photoluminescence (PL) spectra of FNVD under excitation with radiation of wavelength 250 nm to 525 nm at a temperature about 300 K. The nitrogen-vacancy centers of FNVD powders possess two charge states, neutral $((N-V)^0)$ and negative $((N-V)^-)$. From the PL spectra in FIG. 2, two zero-phonon lines (ZPL) are detected at 575.0 nm and 638.0 nm, of which the ZPL at 575.0 nm is derived from the electron transfer of neutral $(N-V)^0$ nitrogen-vacancy centers, and of which the ZPL at 638.0 nm is derived from the electron transfer of negative $(N-V)^-$ nitrogen-vacancy centers ($^3A \rightarrow ^3E$).

Figure 3:
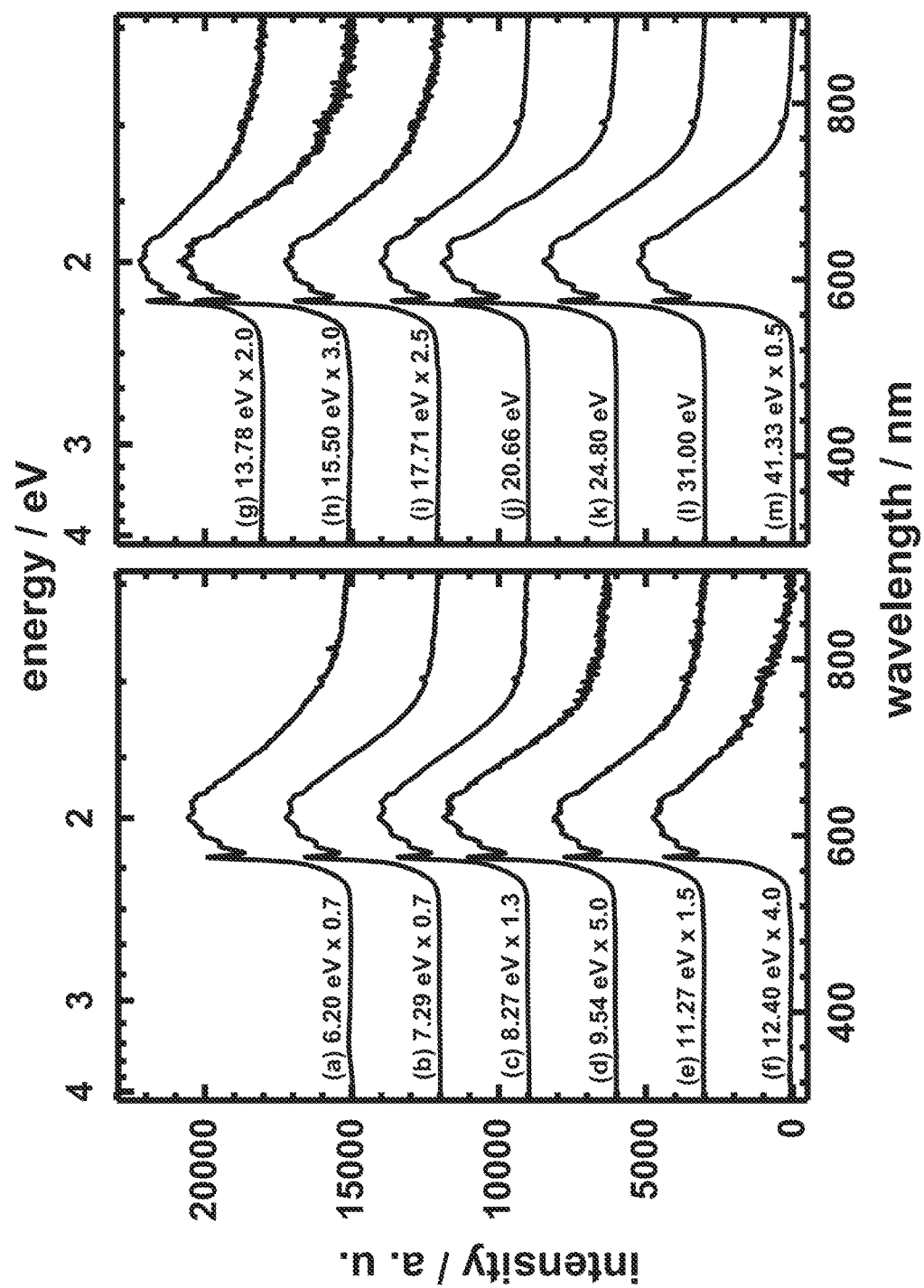
FIG. 3 shows PL spectra of the FNVD excited by VUV having a wavelength 30 nm to 200 nm (6.20 eV to 41.33 eV) at a temperature about 300 K.
Figure 4:
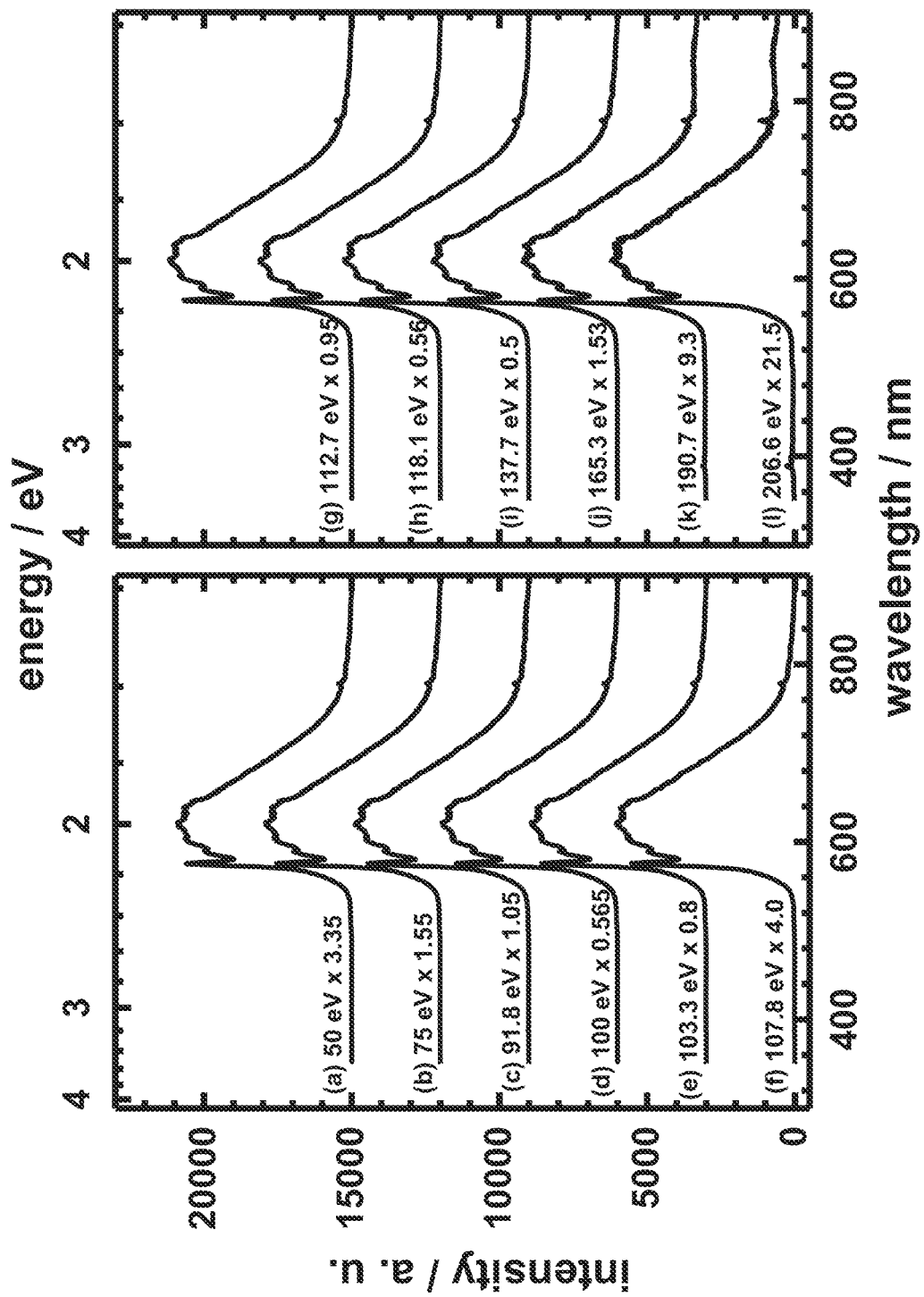
FIG. 4 shows PL spectra of the FNVD excited by EUV having a wavelength 6 nm to 24.8 nm (50 eV to 206.8 eV) at a temperature about 300 K.
Figure 5:
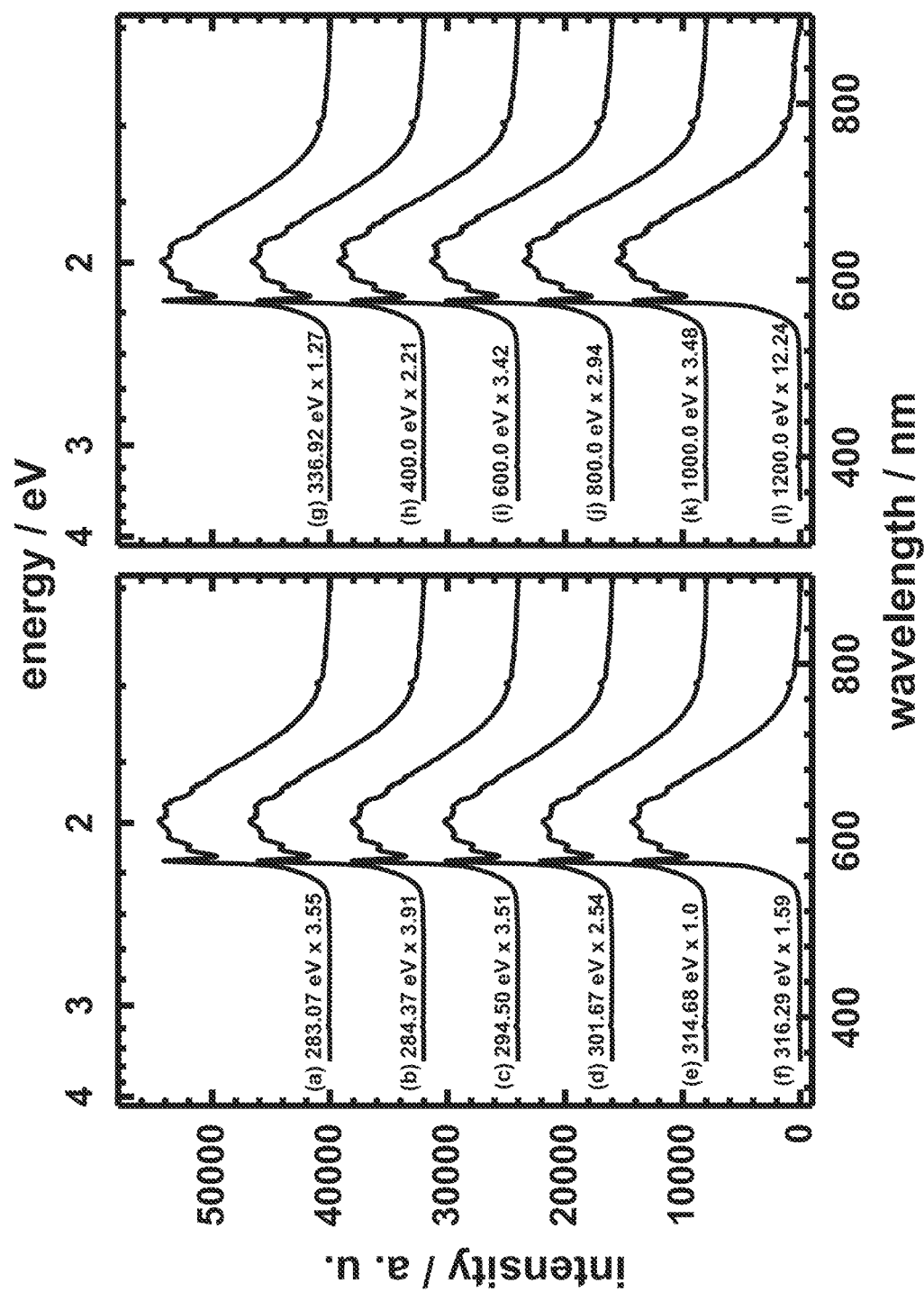
FIG. 5 shows PL spectra of the FNVD excited by X-rays having a wavelength 1.03 nm to 4.38 nm (283.07 eV to 1200 eV) at a temperature about 300 K.

FIG. 3, FIG. 4 and FIG. 5 shows PL spectra of FNVD being excited with VUV/EUV/X-rays of wavelength 1.03 nm to 200 nm (1200 eV to 6.20 eV) at a temperature about 300 K; all magnification as shown is treated with an ordinate scale. The diameter of FNVD particles is about 100 nm, which is greater than the depth (<30 nm) that the VUV/EUV/X-rays can pass within FNVD particles. Comparing FIG. 2 and FIG. 3, the spectra in FIG. 3 have profiles similar to those in FIG. 2; the presence of a ZPL at 576 nm accompanying the phonon sideband of peak about 620 nm is the characteristic of neutral nitrogen-vacancy centers, but no characteristic of a negative nitrogen-vacancy center (i.e., a ZPL at 638.0 nm) is detected. This phenomenon might arise from the subsequent recombination of electron-hole pairs upon relaxation; the energy released from such recombination is about 5.49 eV (equivalent to wavelength 226 nm), which is sufficient to ionize the negatively charged defects to form electronically excited neutral centers. The above-mentioned process requires an energy only 4.8 eV (250 nm). This result indicates that the photoionization of FNVD is efficient, and similar to the cathodoluminescence measurement in which electron radiation is used to irradiate FNVD.

FIG. 4 shows PL spectra of FNVD under excitation with EUV light of energy 50 eV to 206.6 eV (equivalent to a wavelength 6 nm to 24.8 nm) at a temperature about 300 K. FIG. 5 shows PL spectra of FNVD under excitation with X-rays of energy 283.07 eV to 1,200 eV (equivalent to a wavelength 1.03 nm to 4.38 nm) at a temperature about 300 K. Both FIG. 4 and FIG. 5 have spectral characteristics identical, or similar, to those in FIG. 3. Further, if the energy of the VUV/EUV/X-rays used is further increased or set to be greater than about 4.8 eV, that is, an optical wave of wavelength less than about 250 nm, it is also feasible to obtain similar spectral profiles.

Figure 6:
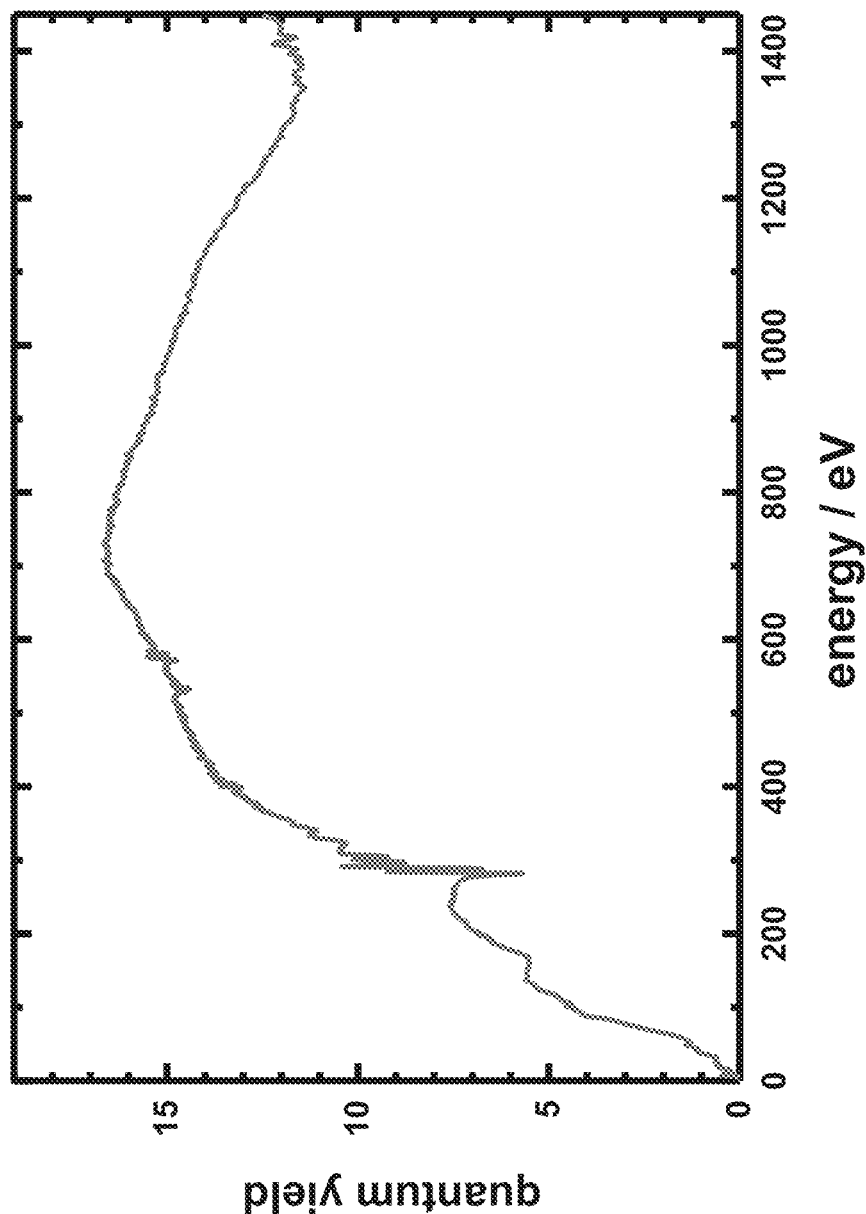
FIG. 6 shows the quantum yield of the FNVD when it emits fluorescence of wavelength 620 nm and is excited with energy to 1450 eV at a temperature about 300 K.

Reference is made to FIG. 6; FIG. 6 shows the quantum yield of the FNVD on monitoring the emissions at 620 nm and exciting the energy to 1450 eV at a temperature about 300 K. The FVND is irradiated with the excitation ray of wavelength 0.86 nm to 300 nm at a temperature about 300 K; the PL spectrum of the FNVD is measured at 620 nm. The quantum yield as shown in FIG. 6 can be obtained on normalizing the PL excitation spectrum. As can be appreciated by persons having ordinary skill in the art, the term quantum yield as used herein refers to the ratio of the number of electrons in an excited state returning to the ground state by the emission of fluorescence and the number of photons of the excitation ray.

In one embodiment, the intensity of the PL excitation spectrum u begins near 5.49 eV (226 nm); the peak quantum yield occurs about 7.0 eV (177 nm). Notably, the initial position at 226 nm coincides with the absorption edge of pure diamond; this phenomenon might indicate that the PL signal is directly associated with the interband absorption of diamond. After the absorption edge, the least quantum yield of the fluorescence with an emission wavelength 620 nm is about 0.19, recorded near about 12.0 eV (100 nm). After exceeding this value, the quantum yield increases as the excitation energy increases, as shown in FIG. 6; for example, a peak value about 17 is achieved about 750 eV (1.65 nm). Such a great quantum yield (>>1) indicates that a plurality of electron-hole pairs are generated upon VUV/EUV/X-rays in the high-energy range. This result is consistent with the photocurrent measurements of diamond-based photodetectors.

It should be noted that the PL excitation spectra of FNVD are continuous in the VUV/EUV/X-ray range according to the present disclosure. Moreover, a greater quantum yield means that the FNVD is highly suitable for use as a sensing unit for VUV/EUV/X-rays.

Figure 7:
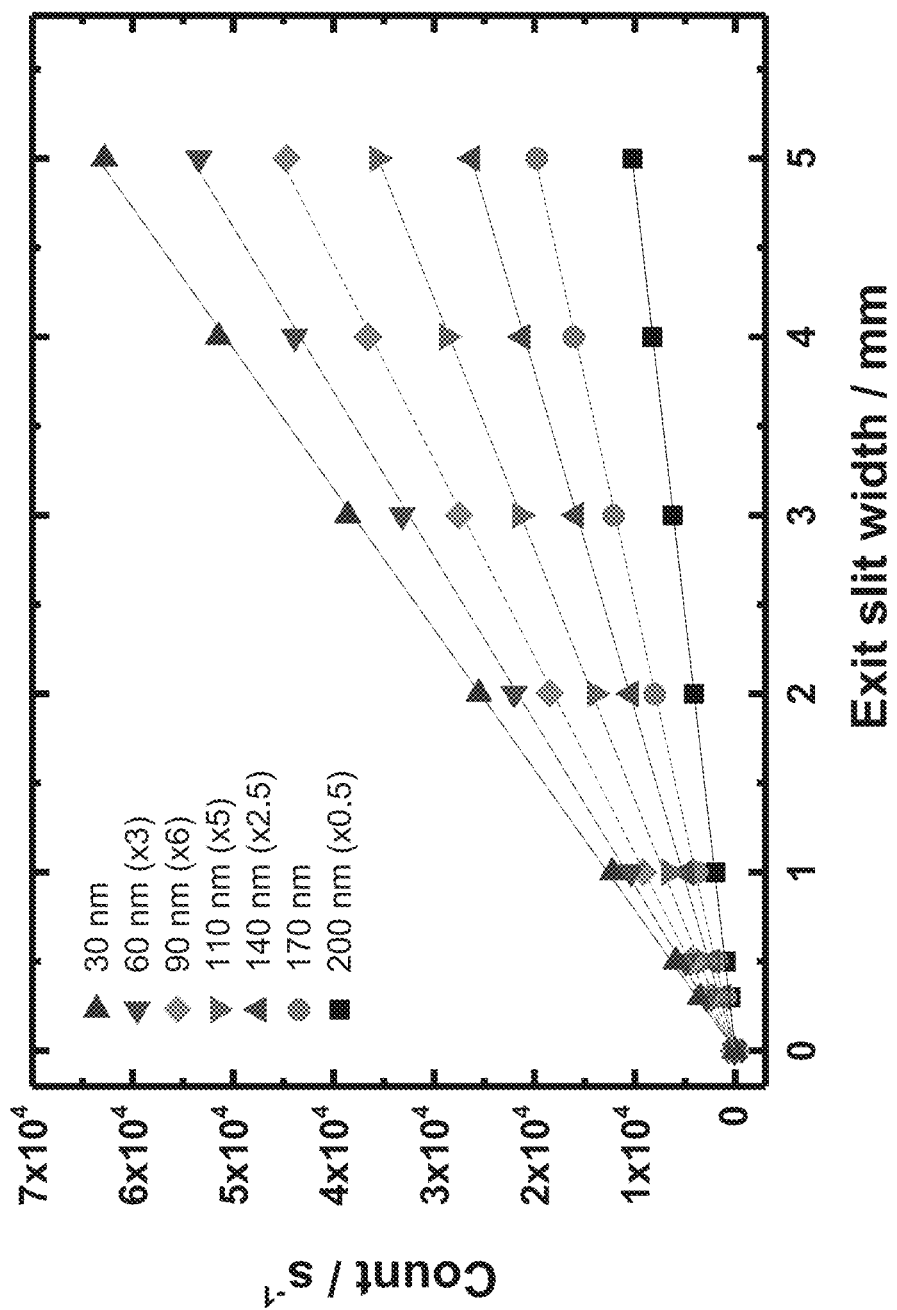
FIG. 7 illustrates the relation of emission intensity at 620 nm for FNVD versus the width of the entrance slit upon excitation with radiation of various wavelengths.

Reference is made to FIG. 7; FIG. 7 illustrates the relation of emission intensity at 620 nm for FNVD versus the width of the entrance slit upon excitation with radiation of various wavelengths. For a bending magnet in a synchrotron light source, the photon flux is linearly proportional to the aperture width of the exit slit when the entrance slit is open wide. As shown in FIG. 7, under varied wavelengths, all PL excitation ray intensities are linearly dependent on the widths of the exit slit. This result indicates that the PL excitation ray intensity of the FNVD is linearly dependent on the photon flux, which demonstrates the suitability of using FNVD as a VUV sensing unit.

The detailed data in FIG. 7 are summarized below: (a) 30 nm; (b) 60 nm (ordinate scale is enlarged three times); (c) 90 nm (ordinate scale is enlarged six times); (d) 110 nm (ordinate scale is enlarged five times); (e) 140 nm (ordinate scale is enlarged two and a half times); (f) 170 nm; and (g) 200 nm (ordinate scale is halved).

Figure 8:
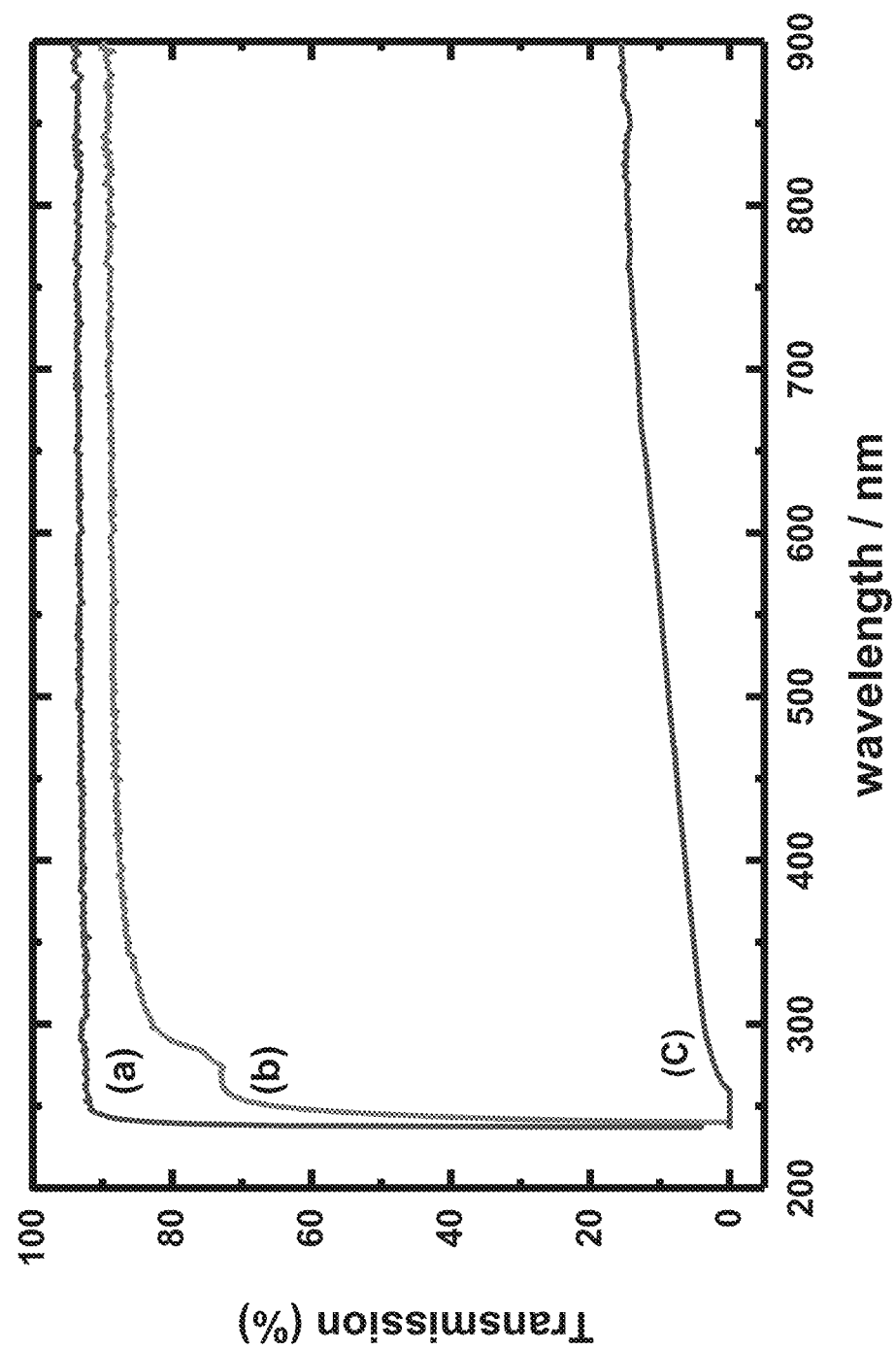
FIG. 8 shows transmission spectra of (a) a viewport, (b) a polyethylene tape on top of the viewport, and (c) FNVD powders adhering to the polyethylene tape attached to the viewport.

To validate the actual operability of the FNVD sensing unit, FNVD powders were attached to a quartz viewport using a polyethylene tape. Reference is made to FIG. 8 that shows transmission spectra of (a) a viewport; (b) a polyethylene tape on top of the viewport; and (c) FNVD powders adhering to the polyethylene tape attached to the viewport. The transmission rate (curve(c)) of the FNVD sensing unit about 300 nm is about 4 percent, and increases monotonically, so that, about 600 nm, the transmission rate increases to about 10 percent, whereas at about 900 nm, the transmission rate increases to about 15 percent; the transmission rate in a range 4 percent to 15 percent is sufficient for measurement.

Figure 9:
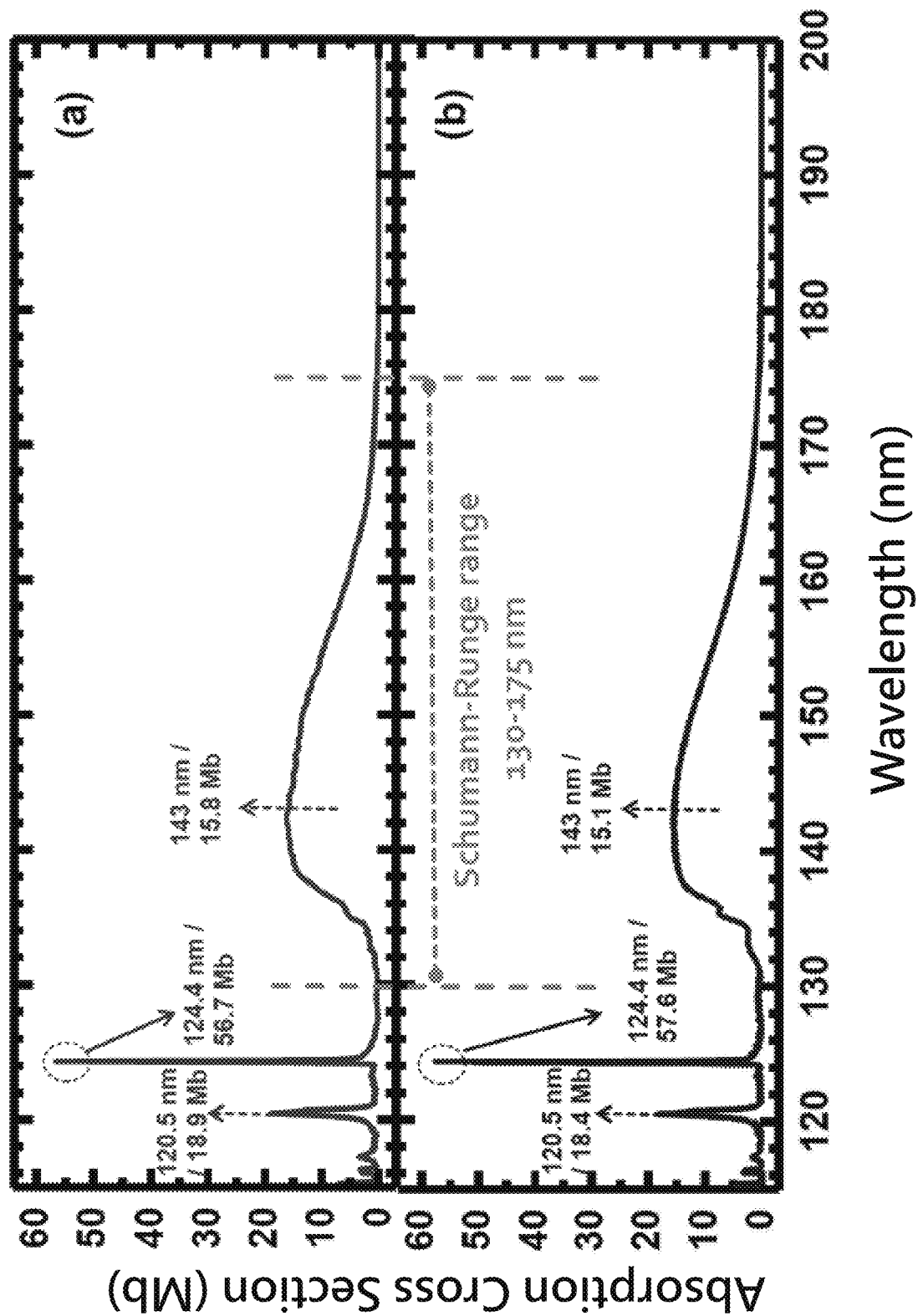
FIG. 9 shows the absorption cross section of gaseous dioxygen molecules measured at a temperature about 300 K in the wavelength range 115 nm to 200 nm using (a) an FNVD sensing unit and (b) sodium salicylate sensing unit.

Reference is made to FIG. 9, which shows a recording of the absorption spectra of gaseous molecules also using the above-mentioned FNVD sensing unit. A sample cell containing the test sample is placed between the VUV light source and the FNVD sensing unit. When VUV light passes through the sample cell, a portion of the light in the wavelength region is absorbed by the test sample; the VUV light passing through the sample cell later irradiates the FNVD sensing unit, in which a photomultiplier (PMT) is used to detect the fluorescence signal emitted in the FNVD sensing unit. This method can be used to determine the absorption cross section of a specific gaseous molecule in the sample cell. In one embodiment, the above-mentioned method was used to measure the absorption cross section of gaseous dioxygen molecules in the wavelength range 115 nm to 200 nm with the FNVD sensing unit (frame (a)) and a sodium salicylate sensing unit (frame (b)) at a temperature about 300 K; the results are shown in FIG. 9.

Considering the systemic errors that might arise from the FNVD sensing unit, the experimental uncertainty of the absorption cross section measurement is about 15% at most. The absorption of dioxygen molecules in the wavelength range 130 nm to 175 nm belongs to the Schumann-Runge (S-R) continuum. On comparison of cross sections measured with the FNVD sensing unit (frame (a)) and the sodium salicylate sensing unit (frame (b)) in the S-R continuum, the values agree satisfactorily within the experimental uncertainty. For instance, the absorption cross section measured with the FNVD sensing unit (frame (a)) at 143.0 nm is 15.8 Mb, which is similar to the absorption cross section 15.1 Mb measured with the sodium salicylate sensing unit (frame (b)) at 143.0 nm. In another example, the absorption cross section measured with the FNVD sensing unit (frame (a)) at 124.4 nm is 56.7 Mb (state: $E\ ^3\Sigma u^-$), which is similar to the absorption cross section 57.6 Mb measured with the sodium salicylate sensing unit (frame (b)) at 124.4 nm. The absorption cross section measured with the FNVD sensing unit (frame (a)) at 120.5 nm is 18.9 Mb (state: $^1\Delta_g$), which is similar to the absorption cross section 18.4 Mb measured with the sodium salicylate sensing unit (frame (b)) at 120.5 nm. As shown in FIG. 9, the differences between the values measured with the FNVD sensing unit (frame (a)) and the sodium salicylate sensing unit (frame (b)) are within 5 percent; these results demonstrate that the FNVD sensing unit as a sensor works as efficiently as a conventional sodium salicylate sensing unit in terms of the measurement of the absorption cross section of gaseous molecules.

Figure 10:
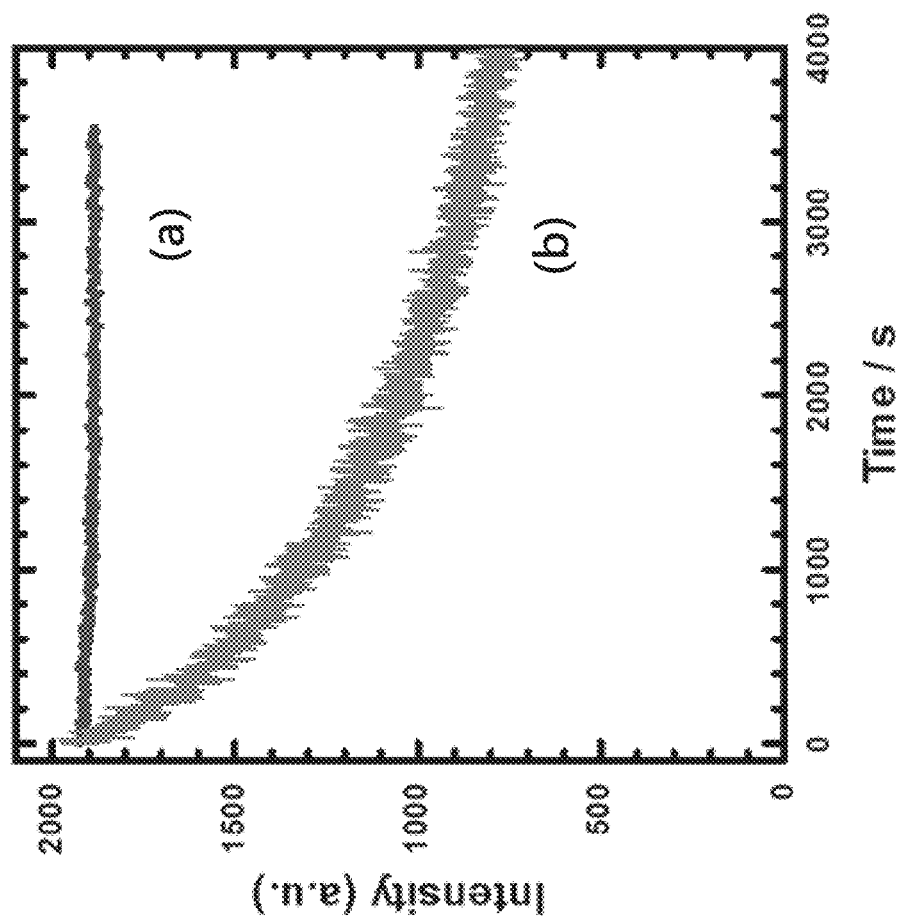
FIG. 10 is a time-decay profile of fluorescence intensities of (a) an FNVD sensing unit and (b) a sodium salicylate sensing unit, under excitation with radiation of wavelength 60 nm.

Reference is made to FIG. 10; FIG. 10 is a time-decay profile of emission fluorescence intensities of (a) an FNVD sensing unit and (b) a sodium salicylate sensing unit, under excitation with radiation of wavelength 60 nm. As shown in FIG. 10, after being excited continuously with radiation of wavelength 60 nm at temperature about 300 K, the level of decay of the fluorescence intensity of the FNVD sensing unit is less than 2 percent. In contrast, under the same operational conditions, the level of decay of the sodium salicylate sensing unit is about 42 percent. Moreover, the fluctuation of the emission fluorescence of the FNVD sensing unit is within 0.6 percent, which is similar to the stability of a synchrotron light source. In contrast, the fluctuation of the emission fluorescence of the sodium salicylate sensing unit is about 5 percent. The above-mentioned results demonstrate that the stability of the FNVD sensing unit is superior to that of the sodium salicylate sensing unit.

Figure 11:
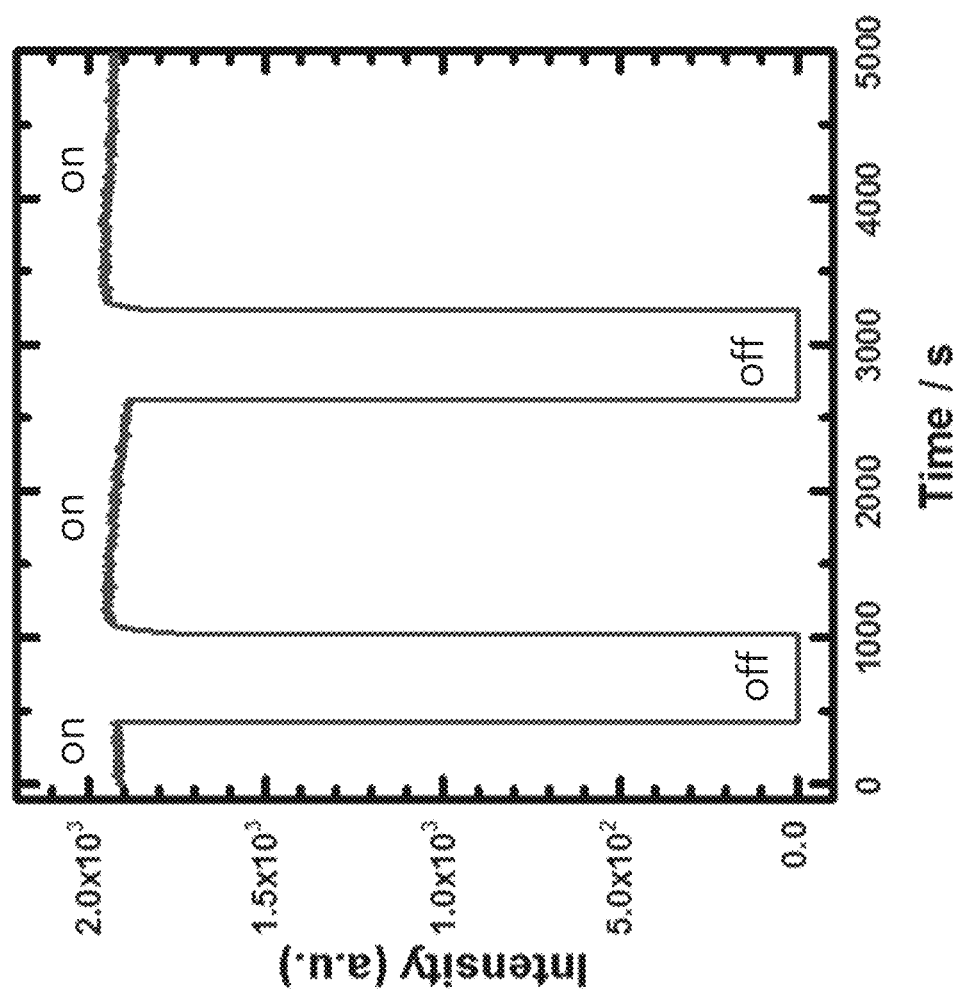
FIG. 11 illustrates the relation of turning on and off the sensing unit versus the irradiated fluorescence intensity of an FNVD sensing unit under excitation with radiation of wavelength 60 nm at a temperature about 300 K.

Regarding the repeatability of the detection performance of the FNVD sensing unit, FIG. 11 illustrates the relation of turning on and off the sensing unit versus the irradiated fluorescence intensity of the FNVD sensing unit under excitation with radiation of wavelength 60 nm at a temperature about 300 K. As FIG. 11 shows, the fluorescence intensity of the FNVD sensing unit might recover almost completely after each on-off cycle, which substantiates a satisfactory repeatability of the FNVD sensing unit.

Figure 12:
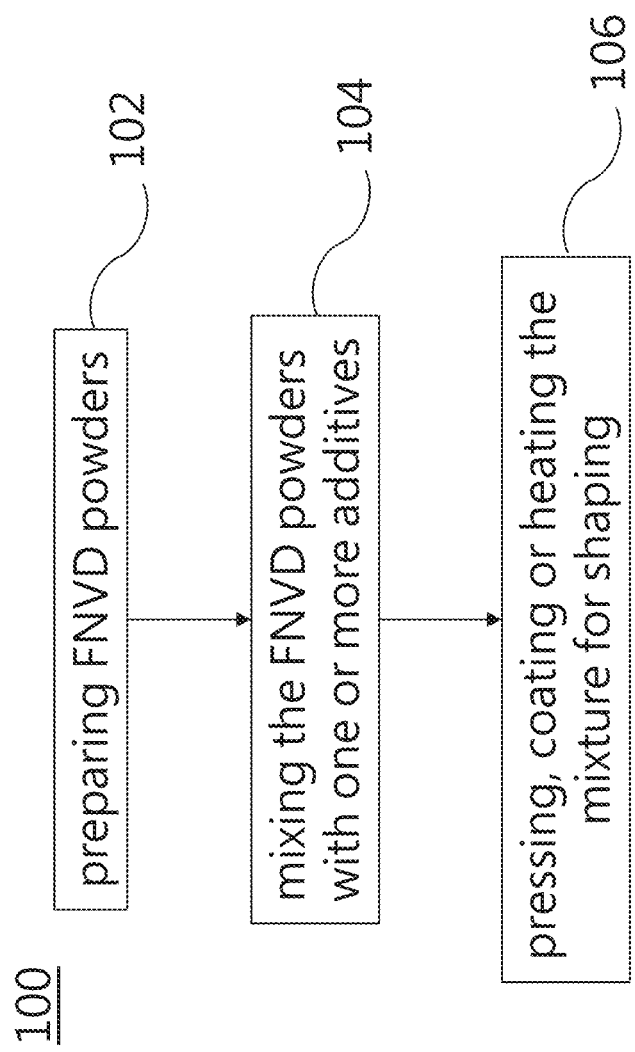
FIG. 12 illustrates a flow chart for manufacturing an FNVD sensing sheet according to one embodiment of the present disclosure.

Reference is made to FIG. 12; FIG. 12 is a process 100 for manufacturing an FNVD sensing sheet according to one embodiment of the present disclosure. The manufacturing process 100 comprises the operations of preparing FNVD powders (Operation 102), mixing the FNVD powders with one or more additives (Operation 104), and pressing, coating or heating the mixture for shaping (Operation 106). Each operation is further discussed below.

Figure 13:
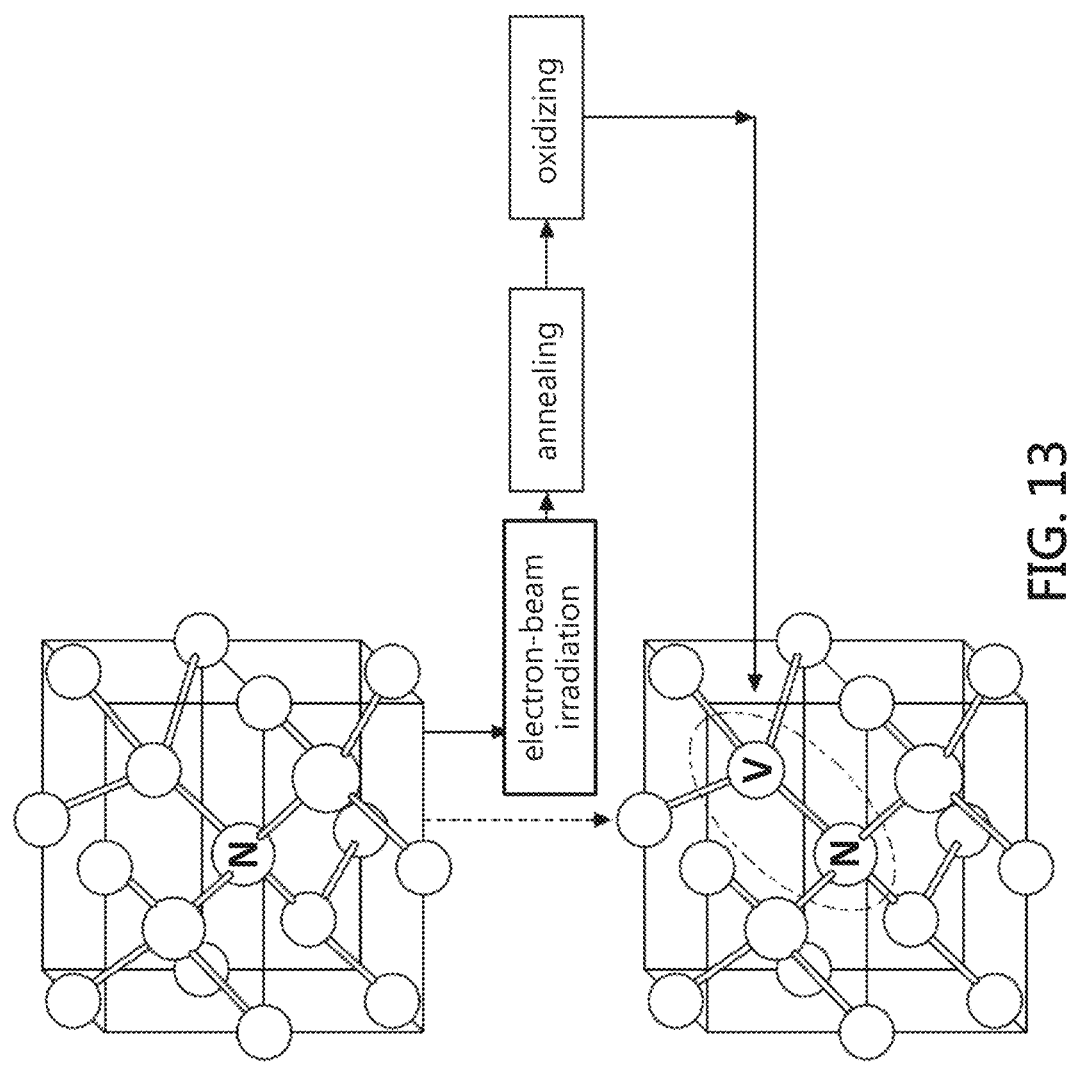
FIG. 13 illustrates a flow chart for manufacturing FNVD powders according to one embodiment of the present disclosure.

Reference is made to FIG. 13; FIG. 13 is a process for manufacturing FNVD powders according to one embodiment of the present disclosure. The FNVD powders might be prepared using type Ib diamond powders. As can be appreciated by persons having ordinary skill in the art, type Ib diamond powders have a minor proportion of nitrogen atoms (for example, 0.05 percent or 500 ppm), which exist in the form of isolated nitrogen atoms. In some embodiments, the type Ib diamond powders have diameters on a nanometre scale, for example, the diameter might be about 1 nm or 10 nm or 100 nm.

In some embodiments, the type Ib diamond powders might be pretreated. For example, the type Ib diamond powders are pretreated with concentrated mixed acids for purification. In some embodiments, the powders might be wetted using de-ionized water between each operation for manufacturing FNVD powders.

In some embodiments, the method for manufacturing FNVD powders might comprise the use of ion beams to irradiate the type Ib diamond powders, so as to break the chemical bonds between carbon atoms, thereby generating vacancy defects. In some embodiments, irradiation with an electron beam or a proton beam can be used. In some embodiments, the flux of the irradiation beams can be adjusted to give an appropriate extent of vacancy defects. In some embodiments, electrom beams of flux about $10^{19}/cm^2$ can be used. In some embodiments, a Rhodotron E-beam accelerator, synchrotron light source, ion implanter, or other apparatus capable of generating the above-mentioned energy can be used.

In some embodiments, the method for manufacturing FNVD powders might further comprise annealing the powders at a high temperature so that the vacancy defects diffuse into the periphery of the nitrogen atoms in the powders to generate nitrogen-vacancy centers (N-V). In some embodiments, the concentration of nitrogen-vacancy centers can be adjusted on controlling the temperature and duration of the annealing. In some embodiments, the annealing temperature is about 600 degrees Celsius to about 1000 degrees Celsius. In some embodiments, the powders are annealed at about 800 degrees Celsius for two hours. In some embodiments, annealing can be performed in an oxygen-deficient environment. In some embodiments, annealing can be performed in a vacuum environment.

In some embodiments, the method for manufacturing FNVD powders might further comprise removing graphitic carbons on the surface. In some embodiments, graphitic carbons can be removed on cleaning the powders using concentrated mixed acids, for example, a mixed solution containing sulfuric acid and nitric acid can be used. In some embodiments, graphitic carbons can be removed on heating the powders. In some embodiments, graphitic carbons are removed on heating and oxidizing the powders in air at 450 degrees Celsius for one hour.

In some embodiments, the method for manufacturing FNVD powders might further comprise analyzing the concentration of nitrogen-vacancy centers. In some embodiments, the Fourier-transform infrared spectra (FTIR) and/or ultraviolet-visible spectra (UV-VIS) can be used so that the concentration of the nitrogen-vacancy centers can be calculated using the optical property of the FNVD powders. For example, in some embodiments, the absorption coefficient of the FNVD powders with respect to a particular radiation intensity can be measured using FTIR, so as to analyze further the concentration of nitrogen-vacancy centers in the FNVD powders. In some embodiments, the UV-VIS spectra can be used to analyze the absorption intensity of the zero-phonon line, so as to analyze further the concentration of nitrogen-vacancy centers.

In some embodiments, the concentration of nitrogen-vacancy centers in the FNVD powders thus prepared is greater than 1 ppm and less than 5 ppm. In some embodiments, the concentration of nitrogen-vacancy centers in the FNVD powders thus prepared is about 1 ppm to 1000 ppm. In some embodiments, the concentration of nitrogen-vacancy centers in the FNVD powders thus prepared is no less than 1000 ppm. In some embodiments, the concentration of nitrogen-vacancy centers in the FNVD powders thus prepared is about 1000 ppm to 10,000 ppm. In some embodiments, the concentration of nitrogen-vacancy centers in the FNVD powders thus prepared is about 1 ppm to 10,000 ppm.

Reference is made again to FIG. 12; in some embodiments, the manufacturing process 100 that manufactures the FNVD powders in the form of a sensing sheet further comprises the operation of mixing the FNVD powders thus prepared with additive(s) (Operation 104). In some embodiments, the additive might comprise refractory metals, such as Mo, W. Nb. Ta and Re, and alloys thereof. In some embodiments, the additive might comprise transition metals, such as Ti, V, Fe, Co, Ni, etc. In some embodiments, the additive might comprise non-metallic materials, such as Si and B, and compounds thereof. In some embodiments, the additive might comprise metal oxides such as alumina, zirconia, magnesium oxide, calcium oxide and cesium oxide. In some embodiments, the additive might comprise calcium bromide and Boehmite (AlO(OH)). In some embodiments, the additive might comprise a polymer, such as polyethylene, polypropylene etc. In some embodiments, the additive can be chosen properly depending on the shaping methods. In some embodiments, mixing other additive(s) with the FNVD powders might further change the property of the FNVD powders. In some embodiments, the additive(s) to the FNVD powders might not substantially change the optical property of the FNVD powders.

Reference is made again to FIG. 12; in some embodiments, the manufacturing process 100 that manufactures the FNVD powders in the form of a sensing sheet further comprises the operation of pressing or coating or heating the FNVD powders thus prepared for shaping (Operation 106). The ways of shaping by pressing or coating or heating include well-known ceramic-forming methods or glass-forming methods or diamond-forming methods, but the present disclosure is not limited to the above-mentioned illustrative shaping methods. For example, the FNVD sensing sheet might also be formed with three-dimensional printing. In some embodiments, Operation 106 further comprises sintering the FNVD powders at a higher temperature. In some embodiments, Operation 106 further comprises heating the FNVD powders in an oxygen-deficient environment or in vacuum to a temperature in a range from about 200 degrees Celsius to about 1500 degrees Celsius.

Figure 14:
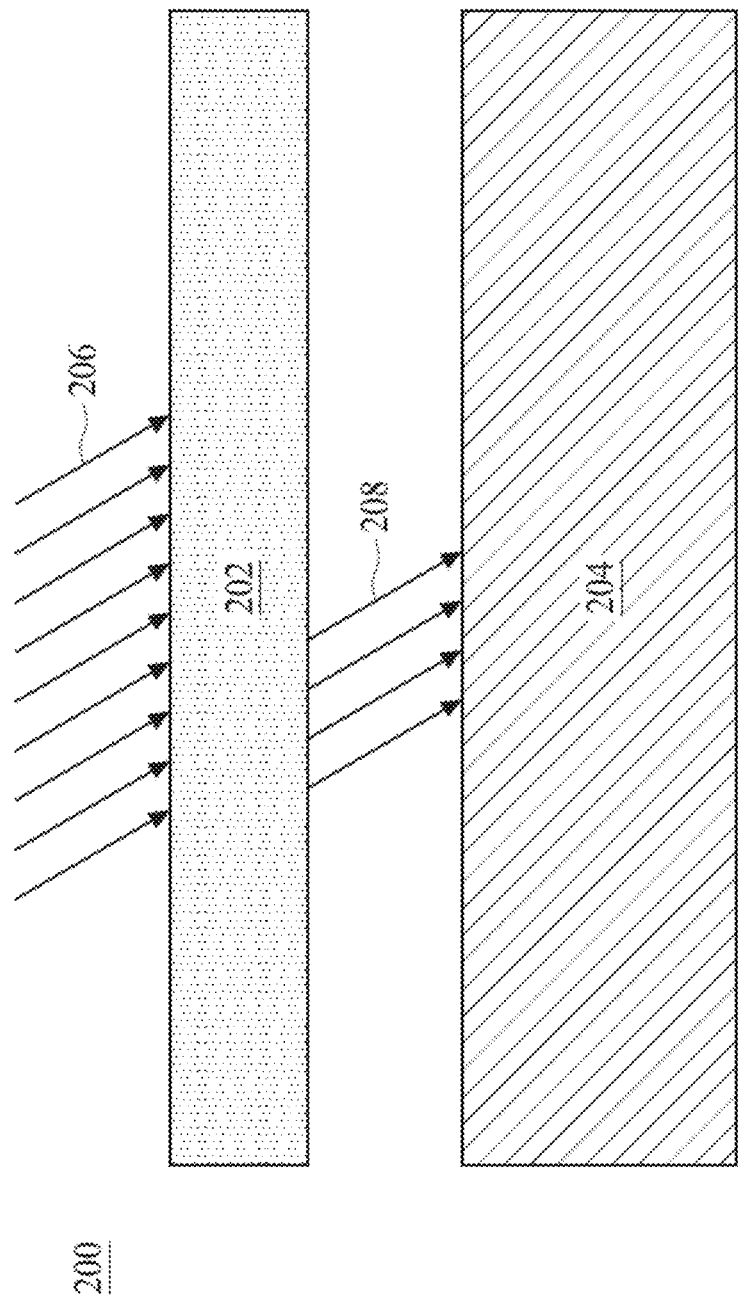
FIG. 14 illustrates a sensor according to one embodiment of the present disclosure.

Reference is made to FIG. 14; FIG. 14 shows a sensor 200 according to one embodiment of the present disclosure. This sensor is a sensing system or sensing device consisting of a plurality of sensing units. In some embodiments, the sensor 200 comprises a first sensing unit 202 and a second sensing unit 204.

In some embodiments, the first sensing unit 202 is, for example, the above-mentioned FNVD sensing sheet discussed with reference to FIG. 12 and FIG. 13, and has a plurality of nitrogen-vacancy centers. In some embodiments, the first sensing unit 202 is coated on top of a viewport or placed at the tube wall of a photomultiplier, wherein, for example, the FNVD powders described above with reference to FIG. 13 are placed at the top, light-receiving portion thereof. In some embodiments, FNVD powders are coated onto the viewport or the tube wall of the photomultiplier to form a FNVD coating layer. In some embodiments, FNVD powders are attached to the viewport or the tube wall of the photomultiplier using a tape or other means. In some other embodiments, FNVD powders are sintered with silicon-oxide powders to form a glass containing FNVD components; the glass containing the FNVD component is further manufactured into the viewport or the tube wall of the photomultiplier.

In some embodiments, the second sensing unit 204 comprises the sensing part of the photomultiplier, the photocell (photovoltaic) or the photodiode or the solar cell, for detecting the second radiation.

In some embodiments, the first sensing unit 202 absorbs a first radiation 206, and emits a second radiation 208. In some embodiments, the second sensing unit 204 detects the second radiation 208. In some embodiments, the first radiation 206 has a wavelength range less than 250 nm. In some embodiments, the first radiation 206 has a wavelength range less than 226 nm. In some embodiments, the first radiation 206 has a wavelength range 30 nm to 200 nm. In some embodiments, the first radiation 206 has a wavelength range 6 nm to 24.8 nm. In some embodiments, the first radiation 206 has a wavelength range 1.03 nm to 4.38 nm. In some embodiments, the first radiation 206 has a wavelength range less than 10 nm. In some embodiments, the second radiation 208 has a wavelength range 540 nm to 850 nm.

In some embodiments, when the first radiation 206 passes through the first sensing unit 202 and is absorbed therein, the first sensing unit 202 converts the first radiation 206 (having a wavelength less than 250 nm) into fluorescence with a large quantum yield. In some embodiments, the quantum yield is at least 0.1. In one embodiment, the quantum yield ranges from about 0.1 to about 17. In some embodiments, the spectrum of the second radiation 208 is displayed though the second sensing unit 204 with a peak about wavelength 573 nm to 578 nm.

Figure 15:
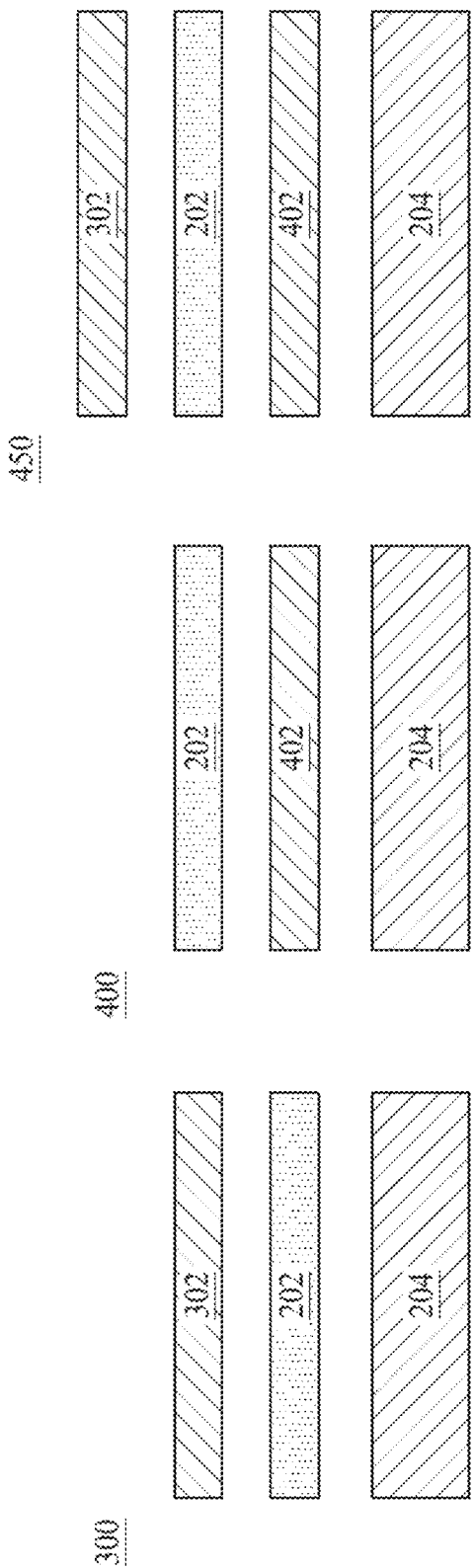
FIGS. 15A-15C illustrate sensors according to embodiments of the present disclosure.

Reference is made to FIGS. 15A-15C; FIGS. 15A-15C illustrate sensors 300, 400 and 450 according to embodiments of the present disclosure. The structures of sensors 300, 400 and 450 are similar to that of the sensor 200 in FIG. 14, wherein the same components are designated with the same numeral numbers, and a detailed description thereof is omitted herein. In some embodiments, the sensor 300 further comprises a first viewport 302, placed on the first sensing unit 202. In some embodiments, the sensor 400 further comprises a second viewport 402, placed between the first sensing unit 202 and the second sensing unit 204. In some embodiments, the sensor 450 further comprises both the first viewport 302 and the second viewport 402.

Figure 16:
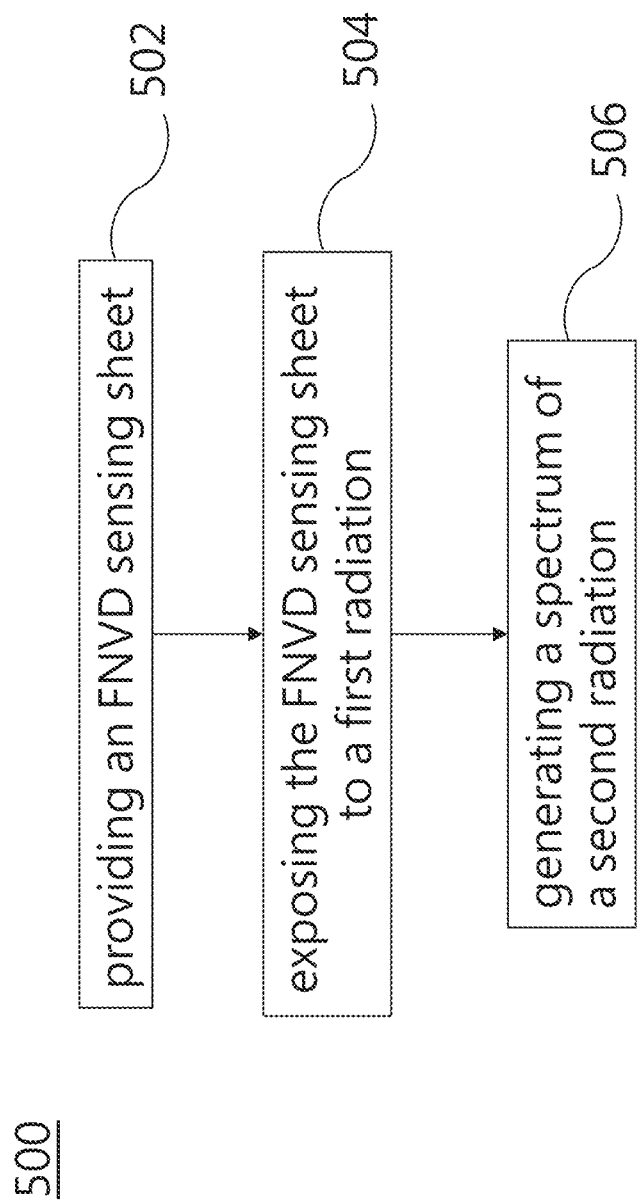
FIG. 16 illustrates a method of sensing radiation according to one embodiment of the present disclosure.

Reference is made to FIG. 16, illustrating a method 500 of sensing radiation according to one embodiment of the present disclosure. In some embodiments, the method 500 comprises the operations of providing an FNVD sensing sheet (Operation 502), exposing the FNVD sensing sheet to a first radiation (Operation 504), and generating a spectrum of a second radiation (Operation 506). The FNVD sensing sheet absorbs the first radiation and then generates the second radiation corresponding to the first radiation; for example, the FNVD sensing sheet absorbs VUV light and then emits a fluorescence at a specific wavelength. For detailed discussion regarding the first radiation absorbed by the FNVD sensing sheet and the second radiation emitted by the FNVD sensing sheet, please refer to the above embodiments in connection with FIG. 14 and FIGS. 15A to 15C. In some embodiments, the spectrum of the second radiation generated in Operation 506 can be, for example, the PL spectra in FIG. 3 to FIG. 5.

Reference is made to FIG. 17; FIG. 17 illustrates a lithography apparatus 600 according to one embodiment of the present disclosure. In some embodiments, the lithography apparatus 600 comprises a sensor 608, configured to output a signal. In some embodiments, the sensor 608 might be the sensors discussed above with respect to FIG. 14 and FIGS. 15A to 15C, wherein the sensor can, via sensing units, absorb the first radiation 206 and emit the second radiation 208.

In some embodiments, the lithography apparatus 600 further comprises a radiation source 602, wherein the radiation source 602 is placed on the wafer in the lithography apparatus 600 to emit the radiation 601. The wafer might be placed on a wafer table 606 in a chamber 612. In some embodiments, the first radiation 206 emitted by the radiation source 602 is absorbed by the sensor 608. In some embodiments, the radiation 601 emitted by the radiation source 602 might be UV, DUV, EUV, VUV, extreme ultraviolet radiation or X-rays. In some embodiments, the radiation source 602 might be a mercury lamp (of radiation wavelength 436 nm (G-line) or 365 nm (I-line)), or a KrF excimer laser (of radiation wavelength 248 nm), or an ArF excimer laser (of radiation wavelength 193 nm), $F_2$ excimer laser (of radiation wavelength 157 nm), or a EUV source of radiation wavelength 13.5 nm. In some embodiments, the lithography apparatus 600 further comprises the wafer table 606, configured to hold the wafer. In some embodiments, the wafer has a photosensitive layer, wherein the photosensitive layer is patterned using the radiation 601 emitted by the radiation source 602 in conjunction with an appropriate exposure.

In some embodiments, the sensor 608 is placed at the periphery of the wafer table 606, so that when the wafer is irradiated by the radiation 601, the sensor 608 is exposed to the radiation and absorbs the radiation 601, concurrently, thereby generating another radiation (e.g., fluorescence) corresponding to the radiation 601. In some embodiments, the sensor 608 might be integrated with the wafer table 606. In some embodiments, the sensor 608 might be integrated with a lighting system 604. In some embodiments, the lithography apparatus 600 comprises a plurality of sensors 608, respectively disposed at the periphery of the wafer table 606 and the interior of the chamber 612, and configured to receive radiation 601 at varied location, thereby generating the corresponding radiation that can be used as the basis of quantitating the radiation 601.

In some embodiments, the lithography apparatus 600 further comprises a processor 610, configured to receive an output signal from the sensor 608 and analyzes and processed said signal. In some embodiments, the sensor 608 receives the radiation 601 from the radiation source 602 and excites other radiation corresponding to the radiation 601, wherein the interior of the sensor 608 is equipped with a sensing module for detecting said other corresponding radiation and convening the same into a machine-readable signal that is delivered to the processor 610 for analysis and processing. In some embodiments, the processor 610 generates spectral information according to the signal outputted by the sensor 608. In some embodiments, the processor 610 further comprises a display (not shown), configured to display the spectral information generated by the processor 610. In some embodiments, the chamber 612 maintains the wafer in a vacuum environment, so that VUV/EUV light can be used to conduct a lithographic process.

In some embodiments, lithography apparatus 600 further comprises the lighting system 604, configured to adjust the radiation emitted by the radiation source 602. In some embodiments, the lithography apparatus 600 further comprises a support structure (not shown), configured to support the patterning components, such as a mask. The patterning components might be transmissive or reflective, and shall be construed widely to include any component that can be used to impart a pattern to the light, thereby forming patterns at the target locations on the wafer. In some embodiments, it also comprises a lens system (not shown), configured to project the radiation onto the wafer. In some embodiments, the lens system comprises a refractive or reflective or catadioptric or magnetic or electromagnetic or electrostatic optical system.

The present specification and the abstract are merely illustrative of one or more embodiments of the invention as anticipated by the inventor or co-inventors, and are not exhaustive of all embodiments. The present specification and abstract are not intended to limit the scope of the invention for which the applicant seeks protection.

According to the manner in which blocks are used above to describe the various functions of varied embodiments of the present invention, the boundaries between the blocks are delineated for ease of description. As long as the specified functions and their relative relations can be properly implemented, the boundaries defined above or in the drawings are not required to be rigidly adhered to.

The description of the specific embodiments of the present specification can sufficiently delineate the general properties of the present invention, so that persons having ordinary skill in the art can make corresponding, appropriate and non-excessive modifications to any embodiment for a specific application without departing from the general spirit of the present disclosure. These modifications are still within the scope of the present disclosure and the equivalence scope thereof.

The scope of the patent disclosure is defined by the scope of the appended claims and their equivalents, and not by the specification or the abstract or the drawings.

What is claimed is:

1. A fluorescent nitrogen-vacancy diamond (FNVD) sensing sheet, having a plurality of nitrogen-vacancy centers of concentration about 1 ppm to about 10,000 ppm;
   wherein, on absorbing a first radiation, the FNVD sensing sheet emits a second radiation, wherein the first radiation has a wavelength range less than 250 nm, and the second radiation has a wavelength range 540 nm to 850 nm.

2. The FNVD sensing sheet of claim 1, wherein the spectrum of the second radiation has a peak wavelength about 573 nm to 578 nm.

3. The FNVD sensing sheet of claim 1, wherein the FNVD sensing sheet converts the first radiation into a fluorescence with a quantum yield at least 0.1.

4. A method for manufacturing a FNVD sensing sheet according to claim 1, comprising:
   preparing a plurality of FNVD powders, and shaping the FNVD powders.

5. The method for manufacturing the FNVD sensing sheet of claim 4, wherein the operation of preparing the plurality of FNVD powders further comprises forming a vacancy defect in a type Ib diamond powder and diffusing the vacancy defect into a peripheral of nitrogen atoms of the FNVD powders.

6. The method for manufacturing the FNVD sensing sheet of claim 5, further comprising:
   annealing the FNVD powders at a temperature in a range from about 600 degrees Celsius to about 1000 degrees Celsius.

7. The method for manufacturing the FNVD sensing sheet of claim 5, further comprising:
   shaping the FNVD powders by pressing, coating or heating the FNVD powders.

8. The method for manufacturing the FNVD sensing sheet of claim 7, further comprising:
   heating the FNVD powders in an oxygen-deficient environment or in a vacuum environment to a temperature in a range from about 200 degrees Celsius to about 1500 degrees Celsius.

9. The method for manufacturing the FNVD sensing sheet of claim 4, further comprising:
   mixing the FNVD powders with an additive, wherein the additive is at least one element selected from the group consisting of Mo, W, Nb, Ta, Re, Ti, V, Fe, Co, Ni, Al, Zr, Mg, Ca, Cs, Si and B, or a compound thereof.

10. The method for manufacturing the FNVD sensing sheet of claim 4, further comprising:
    removing a graphitic carbon at a surface of the FNVD powder.

11. A sensor, comprising:
    a first sensing unit, having a plurality of nitrogen-vacancy centers with a concentration about 1 ppm to about 10,000 ppm, and configured to absorb a first radiation and emit a second radiation; and
    a second sensing unit, configured to detect the second radiation;
    wherein the first radiation has a wavelength range less than 250 nm; and the second radiation has a wavelength range 540 nm to 850 nm.

12. The sensor of claim 11, wherein the second sensing unit comprises a photomultiplier or a photocell or a photodiode or a solar cell.

13. The sensor of claim 11, wherein when the first radiation passes the first sensing unit and is absorbed, the first sensing unit converts the first radiation into a fluorescence with a quantum yield at least 0.1.

14. A lithography apparatus, comprising a sensor of claim 11.

15. The lithography apparatus of claim 14, further comprising a radiation source, configured to emit the first radiation.

16. The lithography apparatus of claim 14, further comprising a processor, configured to generate an emission spectrum of the second radiation.

17. A method for sensing radiation, comprising:
    providing an FNVD sensing sheet according to claim 1, which has a plurality of nitrogen-vacancy centers with a concentration about 1 ppm to about 10,000 ppm;
    exposing the FNVD sensing sheet to a first radiation, wherein the FNVD sensing sheet emits a second radiation corresponding to the first radiation after being exposed to the first radiation, and
    generating a spectrum of the second radiation;
    wherein the first radiation has a wavelength range less than 250 nm, and the second radiation has a wavelength range 540 nm to 850 nm.

* * * * *